United States Patent
Burkert et al.

(10) Patent No.: US 7,168,031 B2
(45) Date of Patent: Jan. 23, 2007

(54) METHOD FOR CHANNEL DECODING A DATA STREAM CONTAINING USEFUL DATA AND REDUNDANT DATA, DEVICE FOR CHANNEL DECODING, COMPUTER-READABLE STORAGE MEDIUM AND COMPUTER PROGRAM ELEMENT

(75) Inventors: Frank Burkert, München (DE); Ralf Buschmann, Geretsried (DE); Gero Bäse, München (DE)

(73) Assignee: Siemens Aktiengesellschaft, Munich (DE)

( * ) Notice: Subject to any disclaimer, the term of this patent is extended or adjusted under 35 U.S.C. 154(b) by 654 days.

(21) Appl. No.: 10/257,724

(22) PCT Filed: Apr. 11, 2001

(86) PCT No.: PCT/DE01/01431

§ 371 (c)(1),
(2), (4) Date: Feb. 24, 2003

(87) PCT Pub. No.: WO01/80432

PCT Pub. Date: Oct. 25, 2001

(65) Prior Publication Data

US 2003/0156663 A1    Aug. 21, 2003

(30) Foreign Application Priority Data

Apr. 14, 2000    (DE) ............................ 100 18 624

(51) Int. Cl.
*H03M 13/00* (2006.01)
(52) U.S. Cl. ................. 714/790; 714/795; 714/786
(58) Field of Classification Search ............... 714/790, 714/795, 755, 780, 786, 774, 776; 348/14.8, 348/14.1
See application file for complete search history.

(56) References Cited

U.S. PATENT DOCUMENTS

| | | | |
|---|---|---|---|
| 5,544,328 A | * | 8/1996 | Seshadri .................. 375/261 |
| 5,703,887 A | | 12/1997 | Heegard et al. |
| 5,978,762 A | * | 11/1999 | Smyth et al. ............. 704/229 |

(Continued)

FOREIGN PATENT DOCUMENTS

DE    34 43 041    5/1986

(Continued)

OTHER PUBLICATIONS

Chang et al. Performance of a TDMA Portable Radio System Using a Cyclic Block Code for Burst Synchronization and Error Detection, pp. 22-31.

(Continued)

*Primary Examiner*—Albert Decady
*Assistant Examiner*—Fritz Alphonse
(74) *Attorney, Agent, or Firm*—Bell, Boyd & Lloyd LLC (57) ABSTRACT

A method is provided for channel decoding a data stream containing useful data and redundant data, the data stream exhibiting at least one known source-coded errored bit sequence which identifies a pre-determined position within the data stream, wherein the data stream is channel decoded, the source-coded errored bit sequence is determined from the channel-decoded data stream, and the data stream is again channel decoded taking into consideration the detected source-coded errored bit sequence.

18 Claims, 4 Drawing Sheets

U.S. PATENT DOCUMENTS

| | | | |
|---|---|---|---|
| 6,031,871 A * | 2/2000 | Schouhamer Immink | ... 375/240 |
| 6,278,478 B1 * | 8/2001 | Ferriere | ..................... 348/14.1 |
| 6,292,922 B1 * | 9/2001 | Ruscitto et al. | ............. 714/795 |
| 6,546,515 B1 * | 4/2003 | Vary et al. | ................... 714/746 |
| 6,629,287 B1 * | 9/2003 | Brink | ......................... 714/755 |
| 6,851,083 B1 * | 2/2005 | Hagenauer et al. | ......... 714/774 |

FOREIGN PATENT DOCUMENTS

| | | |
|---|---|---|
| EP | 0 790 741 | 8/1997 |
| EP | 0 980 148 | 2/2000 |

OTHER PUBLICATIONS

Aign, "Error Concealment, early re-synchronization and iterative decoding" pp. 1654-1658.

Hagenauer, "Source Controlled Channel Decoding", pp. 2449-2457.

Friedrichs, Kanalcodienrung, Springer, ISBN 3-540-58232-0, Seite 1-29, 1996.

Hagenauer, Rate Compatible Punctured Convultional Codes (RCPC Codes) and their applications, pp. 389-400.

Lin et al, Error Control Coding Fundamentals and Applications, 278 ff, 535 ff.

Gall, MPEG: A Video Compression Standard for Multimedia Applications, pp. 47-58.

Heinrich Meyr et al, "Digital Communication Receivers Synchronization, Channel Estimation and Signal Processing" vol. 2.

Hagenauer et al., iterative Decoding of Binary Block and Convolutional Codes, pp. 429-445.

* cited by examiner

METHOD FOR CHANNEL DECODING A DATA STREAM CONTAINING USEFUL DATA AND REDUNDANT DATA, DEVICE FOR CHANNEL DECODING, COMPUTER-READABLE STORAGE MEDIUM AND COMPUTER PROGRAM ELEMENT

BACKGROUND OF THE INVENTION

Methods and devices for channel decoding a data stream containing useful data and redundant data are known from [1].

Figure 2:
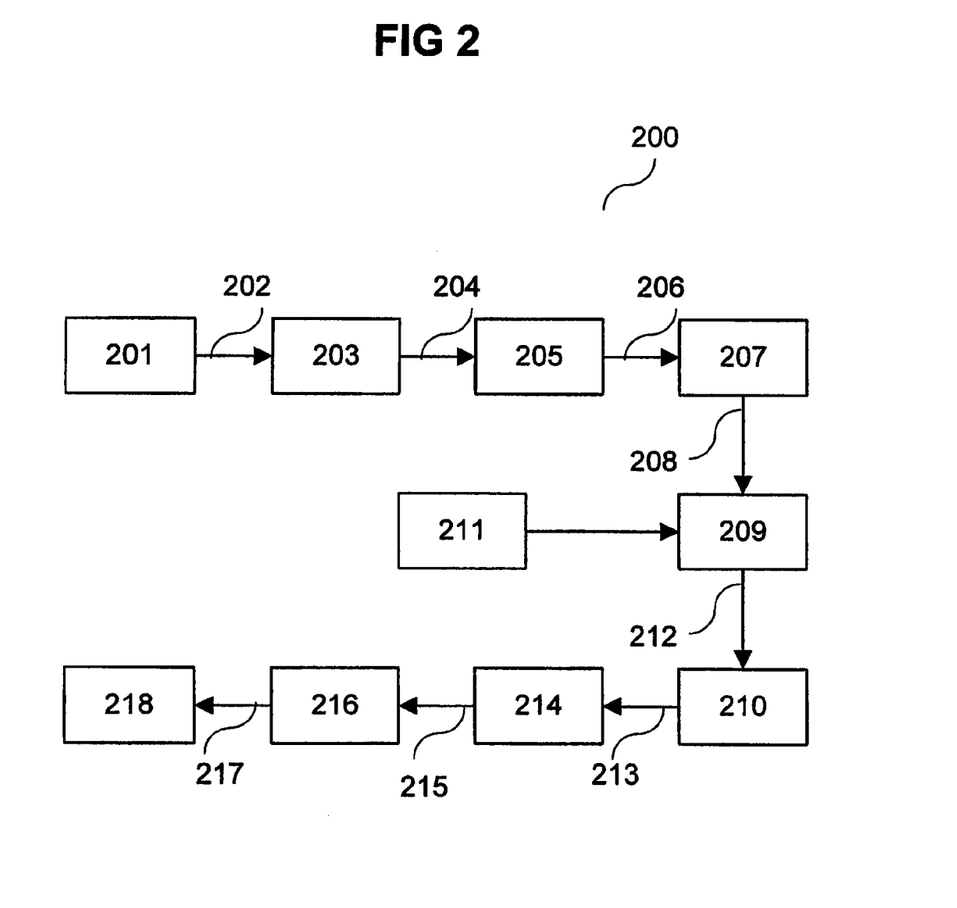
FIG. 2 is a drawing of a model for digital information transmission.

This principle known from is based on the model, shown in FIG. 2, of digital information transmission with channel coding and source coding.

In the model 200 of digital information transmission, source information 202 from a source 201 is supplied to a source coder 203 in which a data stream 204 is generated.

The data stream 204 is supplied to a channel coder 205, coded by it, and the channel-coded data stream 206 is supplied to a modulator 207 where the channel-coded data stream 206 is modulated onto a carrier signal of predeterminable frequency and is supplied as modulated signal 208 via physical channel 209, for example via a radio link or a telephone line, to a receiver which has a demodulator 210.

In the physical channel 209, the modulated signal 208 is subject to disturbances 211 as a result of which a disturbed modulated signal 212 is generated.

A demodulated data stream 213 is supplied to a channel decoder 214, in which channel decoding takes place, as a result of which a channel-decoded data stream 215 is generated. The channel-decoded data stream 215 is decoded in a source decoder 216 and supplied as resultant data stream 217 to a sink 218.

Source coding is understood to be a coding in which the data to be transmitted are compressed; that is to say, superfluous redundancy in the data to be transmitted is eliminated.

In the context of the present invention, channel coding is understood to be a method by which a data stream is coded by adding redundant data so that the data stream to be transmitted with the least possible number of errors can be transmitted from a source to a sink. Thus, redundancy is added in a controlled manner to the actual useful data during the channel coding at the transmitting end so that errors arising during a transmission via the physical channel 209 can be detected and corrected at the receiving end.

A principle on which some methods of channel coding are based is the principle of forward error correction; i.e., errors determined at the receiving end are corrected directly in this principle. Examples of forward error correction methods are methods which use block codes, convolutional codes, punctured convolutional codes or concatenated codes. To illustrate, the channel decoding in forward error correction methods only takes place from the received data stream—i.e., without retransmission requests via a return channel.

Alternative methods for channel coding are the methods called automatic repeat request, ARQ methods for short, which are based on the fact that errors are detected at the receiving end and the transmission errors are corrected with the aid of retransmissions.

The combination of forward error correction methods and ARQ methods is called hybrid ARQ method, described in [2]. In such a method, the useful information is first coded with an error-detecting code at the transmitting end. The useful data, together with the added redundancy, are then coded with an error-correcting code. At the receiving end, the error-correcting code is first decoded (forward error correction). Using error-detecting code, a check is then performed to see whether there are still residual errors in the decoded data stream. If this is so, a retransmission of the data is requested via a return channel (repeat request). The advantage of hybrid ARQ methods is that a quasi-error-free transmission is achieved but a very large delay in the transmission of the complete error-free data must be accepted and the existing bandwidth is not efficiently utilized due to the retransmissions.

The disadvantageous factor in the methods for channel coding and channel decoding is that a large number of redundant data must be added to the useful data, as a result of which the available useful data rate is clearly reduced.

However, a high useful data rate is required particularly for the transmission of video data.

In an ARQ method, a further disadvantage can be seen in the fact that, although protected transmission of the useful data is possible, a considerable delay in the reception of the complete data must be registered at the receiver due to the retransmission of useful data by the transmitter as a result of which such a method is not suitable, in particular, for a real-time application.

For this reason, only relatively simple channel coding methods based on the principle of forward error correction, such as a convolutional code with a soft-decision Viterbi decoder, are normally used; particularly in the transmission of video data. This leads to a high residual error rate after the channel decoding, particularly in the case of a severely disturbed physical channel, as a result of which the image quality of the decoded image is considerably impaired.

From [3], it is known to subject useful data to channel coding twice in succession and, after transmission via the physical channel, to perform channel decoding twice in succession (serial code concatenation). In serial code concatenation, the useful data are coded with an error-correcting code (outer code). The resultant data are then coded with a second code (the inner code). After the transmission, the inner code is channel decoded first, followed by the outer code.

In serial code concatenation, it is known that the decoders exchange information and that the decoding can be iterative (compare [6]). Iterative decoding means that the outer channel decoder does not immediately forward the decoded data stream to the source decoder but first returns a side information item to the channel decoder for the inner code. The latter forwards the data stream contained in the new decoding of the inner code to the outer channel decoder which then also decodes the outer code again. This procedure can be iteratively repeated (iterative decoding).

The disadvantageous factor in this procedure is that the amount of required redundant data is even increased due to doubled channel coding which leads to a further reduction in the available useful data rate in the transmission of data via a physical channel.

From [4], a method for video frame coding is known in which a synchronization code, via which a predetermined position of a data stream element within a part of a digitized frame is in each case described, is provided within the data stream during the source coding.

Thus, a synchronization code can be used, for example, for indicating the beginning or the end of a block, indicating the beginning or the end of a macroblock, or indicating the beginning or the end of a frame.

Furthermore, synchronization codes are usually provided for indicating the beginning or the end of a data packet via which the source-coded data to be transmitted are to be transmitted.

In this manner, it is possible to allocate bit sequences within the received data stream unambiguously to a position within the data stream due to the detected synchronization code during the source decoding. In other words, the synchronization code determines the position of the data stream element within the data stream.

Furthermore, methods which detect synchronization codes in a data stream are known from [5].

The present invention is directed toward channel-decoding a data stream containing useful data and redundant data and making it possible to provide an improved error detection compared with the usual channel decoding methods with a reduced amount of redundant data compared with known methods for forward error correction.

SUMMARY OF THE INVENTION

In a method for channel decoding a data stream containing useful data and redundant data, the data stream exhibiting at least one source-coded errored bit sequence which identifies a predetermined position within the data stream, the corresponding source-coded error-free bit sequence being a known bit sequence, the data stream is channel decoded. The source-coded errored bit sequence is determined from the channel-decoded data stream in a further step and the data stream is again channel decoded. The new channel decoding of the data stream takes place taking into consideration the detected source-coded errored bit sequence.

Since both the position, for example of a synchronization code, and the bit sequence, which is correct with a high probability, has been determined due to the determination of the source-coded errored bit sequence from the channel-decoded data stream, additional information about the correct decoded bit sequence is thus available at the receiver end which now can be used for improving the error detection or error correction during the repeated channel decoding of the data stream.

A device for channel decoding a data stream containing useful data and redundant data, the data stream exhibiting at least one source-coded errored bit sequence which characterizes a predetermined position within the data stream, the corresponding source-coded error-free bit sequence being a known bit sequence, exhibits a processor which is arranged in such a manner that the following method steps can be performed:

the data stream is channel decoded,
the source-coded errored bit sequence is determined,
the data stream is again channel decoded, the repeated channel decoding of the data stream taking place by taking into consideration the detected source-coded errored bit sequence.

The detected source-coded bit sequence/bit sequences taken into consideration can be the detected source-coded bit sequence of the current decoding step and/or bit sequences determined in decoding steps preceding in time (for utilizing the statistical correlations between successive frames).

Furthermore, a computer-readable storage medium is provided in which a computer program for channel coding a data stream is stored. The data stream exhibits useful data and redundant data, the data stream exhibiting at least one source-coded errored bit sequence which identifies a predetermined position within the data stream, the corresponding source-coded error-free bit sequence being a known bit sequence. When the computer program, which is stored in the computer-readable storage medium, is executed by a processor, the following method steps are performed:

the data stream is channel decoded,
the source-coded errored bit sequence is determined from the channel-decoded data stream,
the data stream is again channel decoded, the repeated channel decoding of the data stream taking place by taking into consideration the detected source-coded errored bit sequence.

A computer program element for channel decoding a data stream containing useful data and redundant data can be executed by a processor. The data stream exhibits at least one source-coded errored bit sequence which identifies a predetermined position within the data stream, the corresponding source-coded error-free bit sequence being a known bit sequence. When the computer program element is executed by the processor, the following method steps are performed:

the data stream is channel decoded,
the source-coded errored bit sequence is determined from the channel-decoded data stream,
the data stream is again channel decoded, the repeated channel decoding of the data stream taking place by taking into consideration the detected source-coded errored bit sequence.

A device for channel decoding a data stream containing useful data and redundant data, the data stream exhibiting at least one source-coded errored bit sequence which identifies a predetermined position within the data stream, the corresponding source-coded error-free bit sequence being a known bit sequence, exhibits a channel decoder for channel decoding a data stream. Furthermore, a determining unit for determining a source-coded errored bit sequence from the channel-decoded data stream is provided. The determining unit is connected to the channel decoder in such a manner that the channel decoder can be supplied with information about the source-coded errored bit sequence.

In one embodiment of the present invention, it is provided that during the determining of the source-coded errored bit sequence, the probability that the respective bit value of the bit sequence exhibits a particular value is in each case determined. The result during the so-called soft-decision decoding is that the channel decoder receives very accurate information about the respective bit value and can thus estimate to a very good degree how reliable the information about the detected source-coded errored bit sequence available to the channel decoder is, as a result of which the error detection or error correction achieved is improved further during the repeated channel decoding of the data stream.

The known bit sequence can be a synchronization code of a data stream element of the data stream for unambiguously determining the position of the data stream element within the data stream.

Thus, for example, the data stream element can describe a part of a digitized frame and, in connection therewith, at least one of the following positions can be identified by this synchronization code:

the beginning or the end of a block,
the beginning or the end of a macroblock,
the beginning or the end of a frame.

If data packets are used for transmitting the useful data, the synchronization code can also identify the beginning or the end of a data packet; for example, by a predetermined number of bits having a first predetermined binary value framed by two bits having a second predetermined binary value (first binary value: logical "0", second binary value: logical "1").

In this manner, an information item for synchronizing the individual picture elements or generally the data stream, which is obtained in any case during the source decoding, is used both for detecting errors and for transmitting the detected errors and the associated position of the error within the data stream to the channel decoder as a result of which a further increase in error detection and error correction is achieved during the repeated channel decoding.

In another embodiment of the present invention, the channel coding is done by a convolutional code, particularly by a punctured convolutional code as described in [1].

In the methods for decoding punctured convolutional codes, very good processing of detected, additionally protected information about the decoding is used for distinctly improving the error detection performance.

The source-coded errored bit sequence can be determined by comparison with the source-coded error-free known bit sequence, for example by a simple correlation method which looks for a particular predetermined bit pattern within the received data stream and, when such a bit pattern has been detected with sufficient reliability, accepts the detected bit pattern as source-coded errored bit sequence. The simplest correlation method is a 1-to-1 comparison of the known source-coded error-free bit sequence with the bits in the channel-decoded data stream. In principle, all methods known from the synchronization as described, for example, in [5] can be used.

However, additional information which has been determined by statistical analyses of particular preceded decoded frames or also typical frame sequences also can be used for leading to an improved error detection performance during the repeated channel decoding.

Thus, for example, a statistical analysis of preceding decoded frames, for example video frames during a video conference, can be performed and from the a priori information obtained from this, for example of the particular probabilities of bit changes, statistical associations of locally corresponding areas with temporally preceding frames can be compared for the current frame, that is to say for blocks in the current frame, in order to determine by corresponding areas with a high probability. If, according to the statistical analysis, bits in an immobile area of the picture background should actually be unchanged compared with the bits in the same area of the preceding frame, for example due to very low bit change probabilities, it can be assumed that a bit error has occurred due to a disturbance in the physical channel. The channel decoder, in turn, can be informed of this as additional information and it can be used by the channel decoder during the further channel decoding in order to improve the error detection or error correction, respectively.

Thus, the present invention is particularly suitable for use during a video conference since only a small amount of objects moves during a video conference and a large area of the background remains unchanged as a result of which, the bits in successive frames exhibit a very similar structure in corresponding picture areas, as a result of which the method of analysis described above provides very good results.

Naturally, the corresponding methods of analysis also can be applied to single picture objects, for example to the body or the head of the object which, in each case, perform a uniform movement.

Since the information, particularly about synchronization codes, can be obtained in any case during the source decoding, it is advantageous to perform the determination of the source-coded errored bit sequence during the source decoding and then to supply this information to the channel decoder for repeated channel decoding of the data stream. Since the structure of the source decoder only needs to be changed minimally in this manner, this leads to a very simple and inexpensive implementation of the channel decoding.

Additional features and advantages of the present invention are described in, and will be apparent from, the following Detailed Description of the Invention and the Figures.

DETAILED DESCRIPTION OF THE INVENTION

First Exemplary Embodiment

Figure 1:
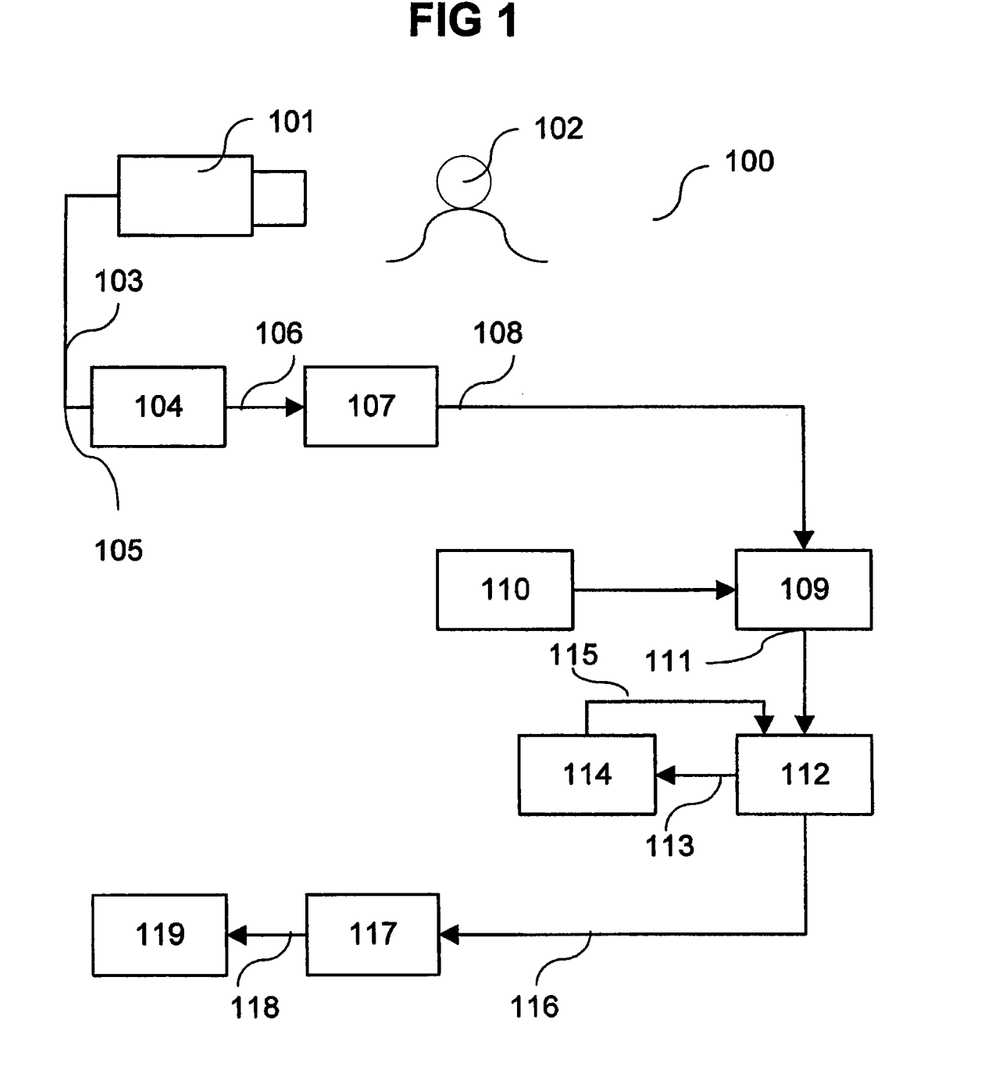
FIG. 1 is a drawing of an arrangement for source coding/channel coding and channel decoding/source decoding of a sequence of video frames according to a first exemplary embodiment of the present invention.

FIG. 1 shows a video communication system 100 with a camera 101 which takes pictures of a user 102 of the video communication system 100. The camera 101 is connected to a source coder 104 via a connection 103. In the source coder 104, the video frames recorded by the camera and digitized (source data stream 105) are source coded according to the MPEG2 standard.

According to the MPEG2 standard, a resultant source-coded source data stream 106 contains a synchronization code 301 for a macroblock via which the beginning of a macroblock of a video frame is unambiguously identified. According to the MPEG2 standard, following the synchronization code 301, the data packet contains a bit sequence as useful data 302 which describes the content of the macroblock; for example, the information of the brightness of the individual pixels of the blocks contained in the macroblock.

Figure 3A:
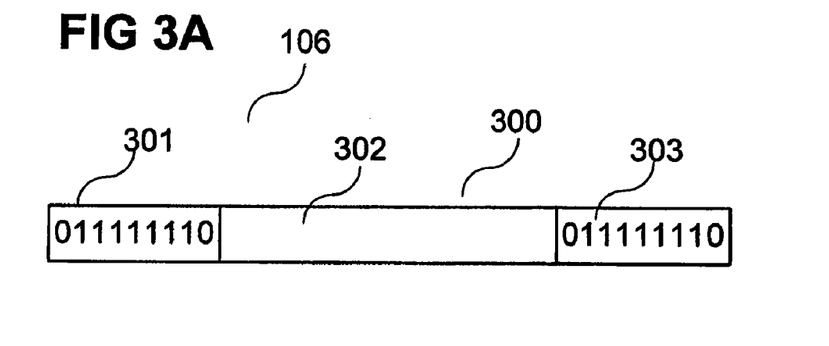
FIGS. 3A to 3D are, in each case, the structure of a data element with respectively one synchronization code at the beginning and at the end of the data packet according to an exemplary embodiment of the present invention.

In a further synchronization code 303, the end of the data packet 300 is identified for the data packet 300 of the macroblock. The first synchronization code 301 and the second synchronization code 303 are unambiguously predetermined bit sequences, a predetermined number of bits having the logical value "1" framed by two bits having the logical binary value "0" according to this exemplary embodiment (compare FIG. 3A).

The source-coded data stream 106 is supplied to a channel coder 107; a convolutional coder according to the present exemplary embodiment which, according to the method described in [2], channel-codes the source-coded data stream 106 to form a channel-coded data stream 108.

After modulation has been performed (not shown), the channel-coded data stream 108 is transmitted to a receiver via a physical channel 109, via a radio link or a telephone link.

During the transmission, a disturbance 110 occurs on the physical channel 109 due to noise. The disturbed channel-coded data stream 111 formed by the disturbance 110 is received by a receiver and, after demodulation, supplied to a channel decoder 112.

Figure 3B:
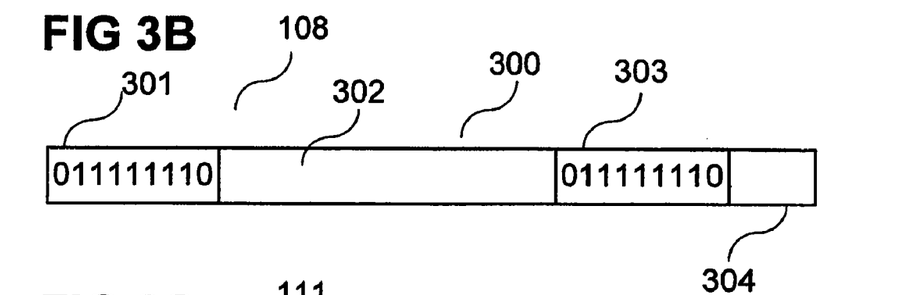

As shown in FIG. 3B, redundant information 304 is added to the packet 300 by the channel coding so that possible errors due to the disturbance 110 during the transmission via the physical channel 109 can be detected during the channel decoding.

According to the method known from [2], channel decoding of the disturbed channel-coded data stream 111 is performed in the channel decoder 112. The channel-decoded data stream 113 formed by the channel decoding is supplied to a determining unit 114.

In the determining unit, the unambiguous bit sequence, predetermined by the synchronization code, in the channel-decoded data stream is determined by a correlation method.

Figure 3C:
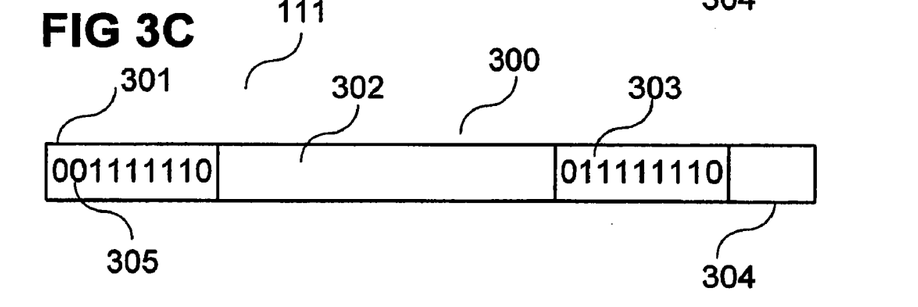

As shown in FIG. 3C, it is assumed for the further embodiment according to the first exemplary embodiment that it is/has been detected with high probability in the first synchronization code 301 in its second bit 305 due to the correlation method described in [5] that the corresponding area of the errored source-coded bit sequence corresponds to the first synchronization code 301.

Since, of course, it is known to the receiver which bit sequence is exhibited by the error-free first synchronization code 301, the errored second bit 305 of the first synchronization code 301 is detected and corrected, according to the present exemplary embodiment, and the corresponding information is supplied to the channel decoder 112 in a feedback loop 115.

The channel decoder 112 channel-decodes the data stream for a second time but now with the additional information, generated by the determining unit 114, about the second bit 305 of the first synchronization code 301 of the corresponding macroblock.

Even if, according to the present exemplary embodiment, only a trivial case is presented in order to illustrate the present invention, is just as well possible, with a correspondingly longer synchronization code or also with correspondingly different correlation methods, to detect a number of bit errors with high probability and to supply this information to the channel decoder 113 which is then used during the second channel decoding of the data stream as a result of which an improved error detection and error correction is achieved during the second channel decoding of the data stream.

The second channel-decoded data stream 116, generated in accordance with the second channel decoding is supplied to a source decoder 117 which performs a source decoding of the received second channel-decoded data stream 116 in accordance with the MPEG 2 method.

The video frame 118 reconstructed by the source decoder 117 is presented to a user of the video communication system 100 on a screen 119.

Figure 3D:
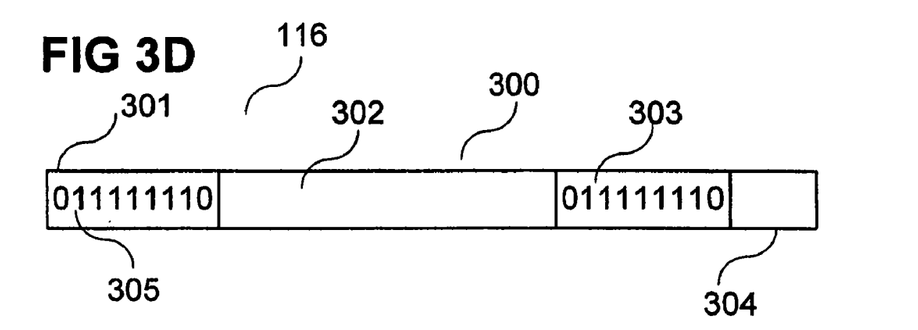

As shown in FIG. 3D, the second bit 305 of the first synchronization code 301 is again set to the correct first binary value of logical "1" by the channel decoder 112 during the second channel decoding. This results in the correct decoding of the first synchronization code 301 by the method according to the present invention.

Second Exemplary Embodiment

According to a second exemplary embodiment of the present invention, a statistical analysis of the picture content is performed for a sequence of test video frames 401, 402, 403, 404, 405 (compare FIG. 4) before the actual channel decoding.

Figure 4:
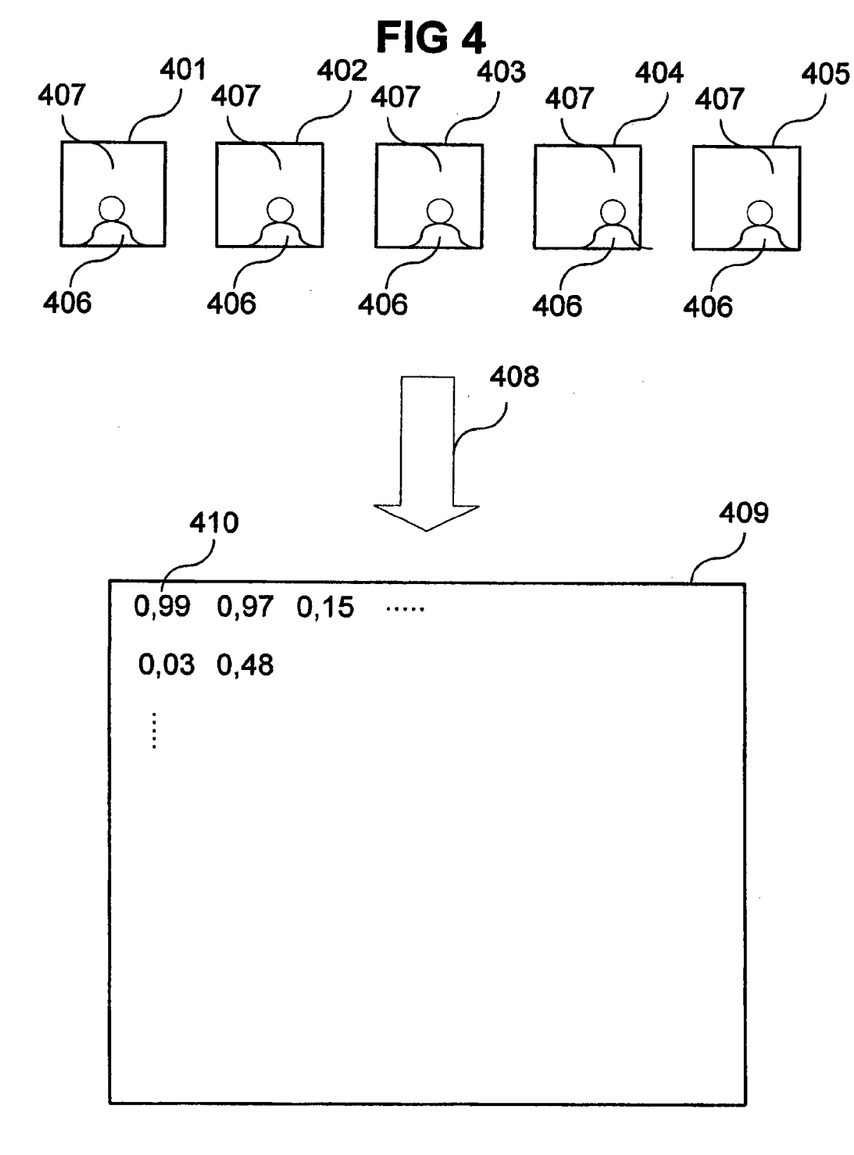
FIG. 4 is a drawing of a number of test frames by which the analysis of statistical associations of individual bits in a video frame with a preceding video frame is shown, and a matrix with bit change probabilities of a video frame which are obtained from the statistical analysis of the test frames.

As can be seen from test frames 401, 402, 403, 404, 405, a user of the video communication system is contained as image object 406 in the respective frame. In addition, each video frame contains a picture background 407. A statistical analysis of the change of the individual bits in the video frame between individual video frames is performed on the test frames 401, 402, 403, 404, 405 (symbolized by arrow 408).

Each video frame is represented by a sequence of bits, with a resolution of 1024×768 pixels in one frame, each pixel being coded with 8 bits as brightness information, resulting in 6,291,456 bits per video frame.

Due to the analysis of the test frames, a test matrix 409 is obtained in which individual bit change probabilities 410 are stored, each bit change probability 410 specifying the probability with which a bit in the bit stream of two successive video frames changes its logical value. According to this exemplary embodiment, 6,291,456 bit change probabilities 410 are thus obtained in the test matrix 409.

According to this second exemplary embodiment, a probability of the correspondence of an errored bit sequence with the error-free bit sequence is thus determined in accordance with the statistical analysis in the determining unit 114 on the basis of the semantic analysis of temporally successive frames during a video conference via the test matrix 409.

According to the method described in [5], the synchronization marks in the channel-decoded video data stream are determined. This information also is then used as a priori information during the repeated channel decoding.

Thus, statistical associations between bit sequences of successive video blocks are determined on the basis of the analysis of previously received and decoded frames, and thus probabilities for a predetermined bit sequence in the data stream are specified.

As such, for parts of the bit stream, a priori information about their occurrence in temporally successive frames is obtained in accordance with the method known from [5].

Thus, for example, a bit change probability can be used as a priori information. For this purpose, an additional analysis is performed for typical image material, for example for a sequence of frames of a test sequence during a video conference for each bit in the data stream, the frequency with which the material changes with temporally successive blocks of successive frames.

According to the second exemplary embodiment, this is done by using the known structure of the coded video data stream for determining the bit change probabilities. For example, it is known, due to the known structure, that there is relationship between certain image regions and groups of bits in the coded video data stream, for example in a group of blocks (GOB). These groups of bits will also be called regions in the further text.

The coded video data stream (bit stream) is then examined for the statistical description according to which the bits within the regions change from frame to frame. From the statistical description, a bit change probability is determined for each bit of a region; i.e., the probability that the value of the respective bit changes from one frame compared with the corresponding bit of the next frame in time is determined.

The detected bit change probabilities, in turn, are reported to the channel decoder 112 which uses this information as a priori information during the second channel decoding of the disturbed channel-coded data stream 111.

In the further text, some alternatives to the exemplary embodiments described above will be presented.

The present invention is not restricted, however, to a transmission of video frames or to a convolutional code for channel coding or channel decoding, respectively.

To illustrate, the present invention can be seen in that information obtained in any case during source decoding is determined for determining errors in the errored channel-decoded data stream, the corresponding error information is supplied to the channel decoder and considered during a second channel decoding of the disturbed data stream.

The determining unit 114 can be integrated both in the source decoder 117 and in the channel decoder 112 itself.

Furthermore, it should be noted that the functions according to the first exemplary embodiment and according to the second exemplary embodiment also can be used combined during channel decoding as a result of which the achievable error detection and error correction is improved further during the second channel decoding of the disturbed channel-decoded data stream 111.

Indeed, although the present invention has been described with reference to specific embodiments, those of skill in the art will recognize that changes may be made thereto without departing from the spirit and scope of the present invention as set forth in the hereafter appended claims.

In this document, the following publications are quoted:
[1] B. Friedrichs, Kanalcodierung [channel coding], Springer, ISBN 3-540-58232-0, page 129, 1996
[2] J. Hagenauer, Rate-Compatible Punctured Convolutional Codes (RCPC-Codes) and their Applications, IEEE-Transactions on Communications, Vol. 36, No. 4, p. 389–400, April 1988
[3] Shu Lin, David Costello: "Error Control Coding—Fundamentals and Applications. Prentice Hall p. 278 ff, p. 535 ff, ISBN 0-13-282796-X
[4] D. Le Gall, MPEG: A Video Compression Standard for Multimedia Applications, Communications of the ACM, Vol. 34, No. 4, p. 47–58, April 1991
[5] Heinrich Meyr, Marc Moeneclaey, Stefan Fechter, Digital Communication Receivers, Volume 2, Synchronisation, Channel Estimation and Signal Processing, John Wiley & Sons, ISBN 0471502758
[6] Joachim Hagenauer, Elke Offer, and Lutz Papke: "Iterative Decoding of Binary Block and Convolutional Codes", IEEE Transactions on Information Theory, vol. 42, p. 429–445, 1996.

The invention claimed is:

1. A method for channel decoding a data stream containing useful data and redundant data, the data stream including at least one source-coded errored bit sequence, the method comprising the steps of:
channel-decoding the data stream;
determining the source-coded errored bit sequence from the channel-decoded data stream;
correlating the source-coded errored bit sequence to a known source-coded errored bit sequence;
determining an error information item about the source-coded error bit sequence from the correlating step;
correcting the source-coded errored bit sequence using said error information item; and
repeating channel-decoding of the data stream, wherein the repeated channel-decoding of the data stream utilizing the corrected source-coded errored bit sequence.

2. A method for channel decoding a data stream as claimed in claim 1, wherein the step of determining the source-coded errored bit sequence includes determining a probability via said correlation that a respective bit value of the bit sequence exhibits a particular value.

3. A method for channel decoding a data stream as claimed in claim 1, wherein the known bit sequence is a synchronization code of a data stream element of the data stream for unambiguously determining a position of the data stream element within the data stream.

4. A method for channel decoding a data stream as claimed in claim 3, wherein the data stream element describes a part of a digitized frame, and the synchronization code identifies at least one of a beginning of a block, an end of a block, a beginning of a macroblock, an end of a macroblock, a beginning of a frame, and an end of a frame.

5. A method for channel decoding a data stream as claimed in claim 3, wherein the synchronization code identifies one of a beginning of a data packet and an end of a data packet.

6. A method for channel decoding a data stream as claimed in claim 3, wherein the data stream describes a part of a digitized frame, and the source-coded error-free bit sequence substantially corresponds to a corresponding source-coded error-free bit sequence of a preceding data stream element.

7. A method for channel decoding a data stream as claimed in claim 6, wherein the source-coded error-free bit sequence is a bit sequence which describes a content of a same area of a frame as the corresponding source-coded error-free bit sequence of the preceding data stream element of the preceding frame.

8. A method for channel decoding a data stream as claimed in claim 7, wherein, to each bit of the source-coded error-free bit sequence, a probability of correspondence with the corresponding bit of the source-coded error-free bit sequence of the preceding data stream element is allocated and taken into consideration during the repeated channel decoding.

9. A method for channel decoding a data stream as claimed in claim 1, wherein channel coding is performed by a convolutional code.

10. A method for channel decoding a data stream as claimed in claim 9, wherein the convolutional code is a punctured convolutional code.

11. A method for channel decoding a data stream as claimed in claim 1, wherein the source-coded errored bit sequence is determined during source decoding of the channel-decoded bit sequence.

12. A method for channel decoding a data stream as claimed in claim 1, wherein the correlation of the source-coded errored bit sequence is determined by a comparison of the channel-decoded data stream with the known source-coded error-free bit sequence.

13. A method for channel decoding a data stream as claimed in claim 12, wherein the source-coded errored bit sequence is assumed to be determined if the comparison produces a correlation value which exceeds a predetermined degree of correspondence.

14. A method for channel decoding a data stream as claimed in claim 1, wherein the method is used during a video conference.

15. A device for channel decoding a data stream containing useful data and redundant data, the data stream including at least one source-coded errored bit sequence, the device comprising:
a channel decoder for repeated channel decoding of the data stream; and
a determining unit that determines a source-coded errored bit sequence from the channel-decoded data stream, wherein the source-coded errored bit sequence is correlated to a known source-coded errored bit sequence, and an error information item about the source-coded errored bit sequence is determined from the correlation to correct the source-coded errored bit sequence, and wherein the determining unit is connected to the channel decoder such that the corrected source-coded errored bit sequence is fed back to the channel decoder for further decoding.

16. A device for channel decoding a data stream as claimed in claim 15, wherein the determining unit is part of a source decoder.

17. A computer-readable storage medium in which a computer program for channel decoding a data stream containing useful data and redundant data is stored, the data stream including at least one source-coded errored bit sequence, the program, when executed by a processor, including the steps of:

channel decoding the data stream;

correlating the source-coded errored bit sequence to a known source-coded errored bit sequence;

determining the source-coded errored bit sequence from the channel-decoded data stream from the correlating step;

determining an error information item about the source-coded errored bit sequence;

correcting the source-coded errored bit sequence using said error information item; and repeating channel decoding of the data stream, the repeated channel decoding of the data stream utilizing the corrected source-code errored bit sequence.

18. A computer program element for channel decoding a data stream containing useful data and redundant data, the data stream including at least one source-coded errored bit sequence, which, when executed by a processor, includes the steps of:

channel decoding the data stream;

correlating the source-coded errored bit sequence to a known source-coded errored bit sequence;

determining the source-coded errored bit sequence from the channel-decoded data stream from the correlating step;

determining an error information item about the source-coded errored bit sequence;

correcting the source-coded errored bit sequence using said error information item; and repeating channel decoding of the data stream, the repeated channel decoding of the data stream utilizing the corrected source-code errored bit sequence.

* * * * *